US012733496B2

(12) United States Patent
Lee et al.

(10) Patent No.: US 12,733,496 B2

(45) Date of Patent: Sep. 8, 2026

(54) SEMICONDUCTOR DEVICE

(71) Applicant: POWER MASTER SEMICONDUCTOR CO., LTD., Cheongju-si (KR)

(72) Inventors: Taekkeun Lee, Seoul (KR); In-Suk Kim, Bucheon-si (KR); Ki-Myung Yoon, Bucheon-si (KR); Jooyaung Eom, Gimpo-si (KR); Soonho Kwon, Bucheon-si (KR)

(73) Assignee: POWER MASTER SEMICONDUCTOR CO., LTD., Cheongju-si (KR)

( * ) Notice: Subject to any disclaimer, the term of this patent is extended or adjusted under 35 U.S.C. 154(b) by 356 days.

(21) Appl. No.: 18/396,035

(22) Filed: Dec. 26, 2023

(65) Prior Publication Data

US 2024/0213208 A1 Jun. 27, 2024

(30) Foreign Application Priority Data

Dec. 27, 2022 (KR) ........................ 10-2022-0186100
Dec. 6, 2023 (KR) ........................ 10-2023-0175695

(51) Int. Cl.
*H10W 40/25* (2026.01)
*H10W 72/60* (2026.01)
*H10W 90/00* (2026.01)

(52) U.S. Cl.
CPC ......... *H10W 40/255* (2026.01); *H10W 90/00* (2026.01); *H10W 72/621* (2026.01); *H10W 90/763* (2026.01); *H10W 90/764* (2026.01)

(58) Field of Classification Search
CPC . H10W 72/60; H10W 72/621; H10W 90/763; H10W 72/642; H10W 72/641
See application file for complete search history.

(56) References Cited

U.S. PATENT DOCUMENTS 11,018,117 B2 * 5/2021 Mohn .................. H10W 90/00
2016/0079155 A1 * 3/2016 Kawase .............. H10W 70/658 257/712

(Continued)

FOREIGN PATENT DOCUMENTS

CN 100581036 C * 1/2010 ............ H02M 7/003
DE 202014003171 U1 * 5/2014 .......... H10W 90/701

(Continued)

*Primary Examiner* — Evren Seven

(74) *Attorney, Agent, or Firm* — LEX IP MEISTER, PLLC

(57) ABSTRACT

Provided is a semiconductor device. A semiconductor device is implemented as a semiconductor module package for driving an inverter, the semiconductor device may include: a first upper metal layer in which a plurality of semiconductor chips implementing a right phase switching pattern are disposed along a first direction to form a first row; a second upper metal layer in which a plurality of semiconductor chips implementing a left phase switching pattern are disposed along the first direction to form a second row; a first connection, in the first upper metal layer, connecting a plurality of semiconductor chips disposed along the first row to each other in series and to the second upper metal layer in parallel; and a second connection, in the second upper metal layer, connecting a plurality of semiconductor chips disposed along the second row to each other in series.

20 Claims, 12 Drawing Sheets

(56) References Cited

U.S. PATENT DOCUMENTS

2017/0178995 A1* 6/2017 Hino .................... H10W 40/22
2017/0236773 A1 8/2017 Chi et al.
2018/0351498 A1* 12/2018 Ilic .......................... H02P 27/04
2020/0066686 A1* 2/2020 Mohn .................. H10W 90/00
2021/0313243 A1* 10/2021 McPherson ........... H10W 90/00
2021/0313256 A1* 10/2021 McPherson ......... H10W 70/481

FOREIGN PATENT DOCUMENTS

JP 2008220045 A * 9/2008 .............. B60L 3/003
JP 2014-229763 12/2014
JP 2016-100442 5/2016
JP 2020-519024 6/2020
WO WO-2012073306 A1 * 6/2012 .......... H10W 90/811
WO 2021-186888 9/2021
WO WO-2022226142 A1 * 10/2022 .......... H10W 70/658

* cited by examiner

SEMICONDUCTOR DEVICE

CROSS-REFERENCE TO RELATED APPLICATION

This application claims priority to and the benefit of Korean Patent Application No. 10-2022-0186100 filed in the Korean Intellectual Property Office on Dec. 27, 2022, and Korean Patent Application No. 10-2023-0175695 filed in the Korean Intellectual Property Office on Dec. 6, 2023, the entire contents of which are incorporated herein by reference.

BACKGROUND OF THE INVENTION

(a) Field of the Invention

The present disclosure relates to a semiconductor device, and more specifically, to a semiconductor module package for driving an inverter.

(b) Description of the Related Art

Power semiconductor devices are used to control and change electrical energy and can mainly operate under high voltage and high current conditions. Power semiconductor devices can be used in motor drive and battery management systems in electric and hybrid vehicles, can be used to precisely control the speed and torque of motors in factory automation and robotics, and can be widely used for power conversion and power supply in a variety of other high-power applications. Power semiconductor devices can operate under high voltage and high current conditions, so high efficiency and stability are required. For example, insulated gate bipolar transistors (IGBTs) are power electronics devices which have high-input impedance characteristics like metal oxide semiconductor field effect transistors (MOSFETs) and also have low conduction loss characteristics like bipolar junction transistors (BJTs), and are suitable for applications that require high switching speed while maintaining high voltage. As another example, silicon carbide (SiC) is a high-performance semiconductor material having higher electrical conductivity, higher thermal conductivity, the ability to operate devices at higher temperatures, higher voltage and current densities, higher switching speeds, as compared to silicon, and SiC semiconductors may be suitable for high-power, high-temperature, or high-frequency applications.

The semiconductor module for driving an inverter can convert direct current power to alternating current power through switching operations of power semiconductor devices. Power semiconductor devices can switch on/off states according to a set sequence and timing. Inductance is a property that resists changes in current in an electric circuit, and in order to increase performance and efficiency, it is necessary to minimize the inductance of the semiconductor module for driving the inverter.

SUMMARY OF THE INVENTION

The present disclosure attempts to provide a semiconductor device including a semiconductor module package for driving an inverter designed to reduce inductance while minimizing size.

A semiconductor device according to an embodiment may be implemented as a semiconductor module package for driving an inverter, the semiconductor device may include: a first upper metal layer in which a plurality of semiconductor chips implementing a right phase switching pattern are disposed along a first direction to form a first row; a second upper metal layer in which a plurality of semiconductor chips implementing a left phase switching pattern are disposed along the first direction to form a second row; a first connection, in the first upper metal layer, connecting a plurality of semiconductor chips disposed along the first row to each other in series and to the second upper metal layer in parallel; and a second connection, in the second upper metal layer, connecting a plurality of semiconductor chips disposed along the second row to each other in series.

In some embodiments, the first connection may include a body portion formed to extend along the first direction; and a parallel connection extension leg portion formed to extend from the body portion along a second direction perpendicular to the first direction.

In some embodiments, the body part may include semiconductor chip bonding regions each formed in a recessed shape to be bonded the plurality of semiconductor chips; and extension leg portion connection regions alternately disposed between the semiconductor chip bonding regions, and each formed in a protruding shape to be connected with the parallel connection extension leg portion.

In some embodiments, a connection bonding part on semiconductor chip to which the semiconductor chip bonding region is bonded may be formed on a plurality of semiconductor chips of the first upper metal layer.

In some embodiments, the first upper metal layer may include a connection bonding part on substrate where the parallel connection extension leg portion is bonded to the first upper metal layer, and the first connection may form a connection to both the connection bonding part on substrate to which the parallel connection extension leg portion is bonded, and the connection bonding part on semiconductor chip.

In some embodiments, the first connection may further include a serial connection extension leg portion formed to extend from the body portion along the first direction.

In some embodiments, the first upper metal layer may further include a connection bonding part on substrate where the serial connection extension leg portion is bonded to the first upper metal layer, and the first connection may form a connection to all of the connection bonding part on substrate to which the parallel connection extension leg portion is bonded, the connection bonding part on substrate to which the serial connection extension leg portion is bonded, and the connection bonding part on semiconductor chip.

In some embodiments, the second connection may include a body portion formed to extend along the first direction; and a serial connection extension leg portion formed to extend from the body portion along the first direction.

In some embodiments, the semiconductor device may further include a third upper metal layer including a connection bonding part on substrate to which the serial connection extension leg portion is bonded, wherein the second connection may form a connection to all of the connection bonding part on substrate to which the serial connection extension leg portion is bonded, and bonding parts formed on a plurality of semiconductor chips of the second upper metal layer.

In some embodiments, the semiconductor device may further include a fourth upper metal layer that applies a gate voltage to a plurality of semiconductor chips disposed on the first upper metal layer; a fifth upper metal layer that applies a source voltage to a plurality of semiconductor chips disposed on the first upper metal layer; a sixth upper metal layer that applies a gate voltage to a plurality of semiconductor chips disposed on the second upper metal layer; and a seventh upper metal layer that applies a source voltage to a plurality of semiconductor chips disposed on the second upper metal layer.

In some embodiments, the first upper metal layer and the second upper metal layer may be included in an upper substrate, a ceramic layer may be formed under the upper substrate, and a lower metal layer may be formed under the ceramic layer.

In some embodiments, the connection may include a clip or a wire.

A semiconductor device according to an embodiment may be implemented as a semiconductor module package for driving an inverter, the semiconductor device may include: a first upper metal layer in which a plurality of semiconductor chips implementing a right phase switching pattern are disposed along a first direction to form a first row; and a second upper metal layer in which a plurality of semiconductor chips implementing a left phase switching pattern are disposed along the first direction to form a second row, wherein a connection bonding part on semiconductor chip is formed on a plurality of semiconductor chips of the first upper metal layer, and a connection bonding part on substrate is disposed along the first direction between the first row and the second row to form a third row on the second upper metal layer.

In some embodiments, the connection bonding part on substrate and the connection bonding part on semiconductor chip on the first upper metal layer may be all connected by one connection.

In some embodiments, a connection bonding part on substrate may be further disposed on the first row on the second upper metal layer.

In some embodiments, the connection bonding part on substrate on the third row, the connection bonding part on substrate on the first row, and the connection bonding part on semiconductor chip on the first upper metal layer may be all connected by one connection.

In some embodiments, a connection bonding part on semiconductor chip may be formed on a plurality of semiconductor chips of the second upper metal layer.

In some embodiments, the semiconductor device may further include a third upper metal layer including a connection bonding part on substrate, wherein the connection bonding part on substrate and the connection bonding part on semiconductor chip on the second upper metal layer are all connected by one connection.

In some embodiments, the semiconductor device may further include a fourth upper metal layer that applies a gate voltage to a plurality of semiconductor chips disposed on the first upper metal layer; a fifth upper metal layer that applies a source voltage to a plurality of semiconductor chips disposed on the first upper metal layer; a sixth upper metal layer that applies a gate voltage to a plurality of semiconductor chips disposed on the second upper metal layer; and a seventh upper metal layer that applies a source voltage to a plurality of semiconductor chips disposed on the second upper metal layer.

In some embodiments, the first upper metal layer and the second upper metal layer may be included in an upper substrate, a ceramic layer may be formed under the upper substrate, and a lower metal layer may be formed under the ceramic layer.

DETAILED DESCRIPTION OF THE EMBODIMENTS

Figure 1:
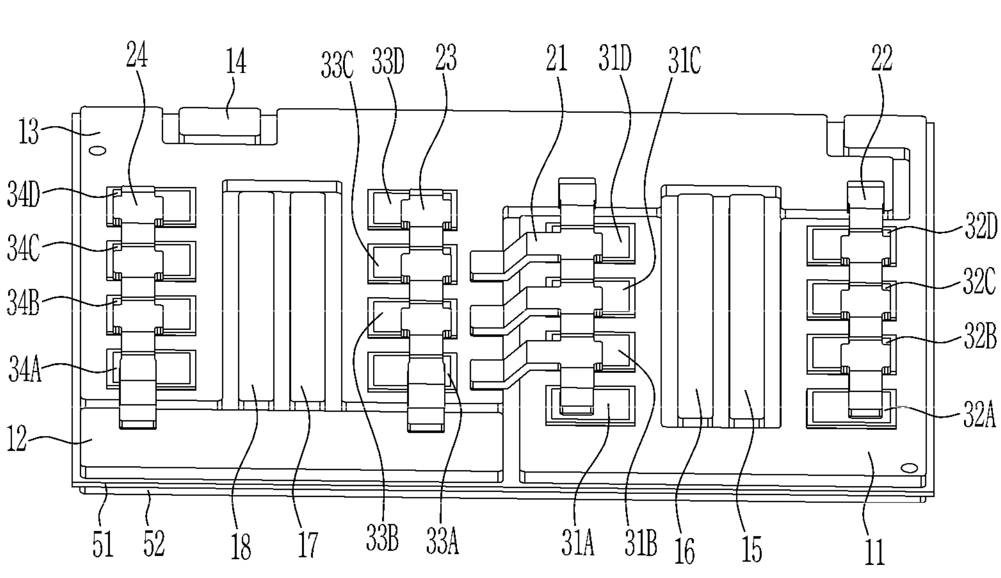
FIG. 1 to FIG. 2 are drawings for explaining a semiconductor device according to an embodiment.

Hereinafter, embodiments of the present invention will be described in detail with reference to the accompanying drawings such that those skilled in the art can easily implement them. However, the present invention can be implemented in various different forms and is not limited to the following embodiments. The drawings are to be regarded as illustrative in nature and not restrictive. Like reference numerals designate like elements throughout the specification.

Throughout the specification and the claims, unless explicitly described to the contrary, the word "comprise", and variations such as "comprises" or "comprising", will be understood to imply the inclusion of stated elements but not the exclusion of any other elements. Meanwhile, throughout the specification and the claims, the terms "up", "down", "left" and "right" are relatively defined based on the accompanying drawings only for clearly and easily explaining embodiments, and it is clear that they are not intended to limit any component to an absolute specific direction in the present invention.

Figure 2:
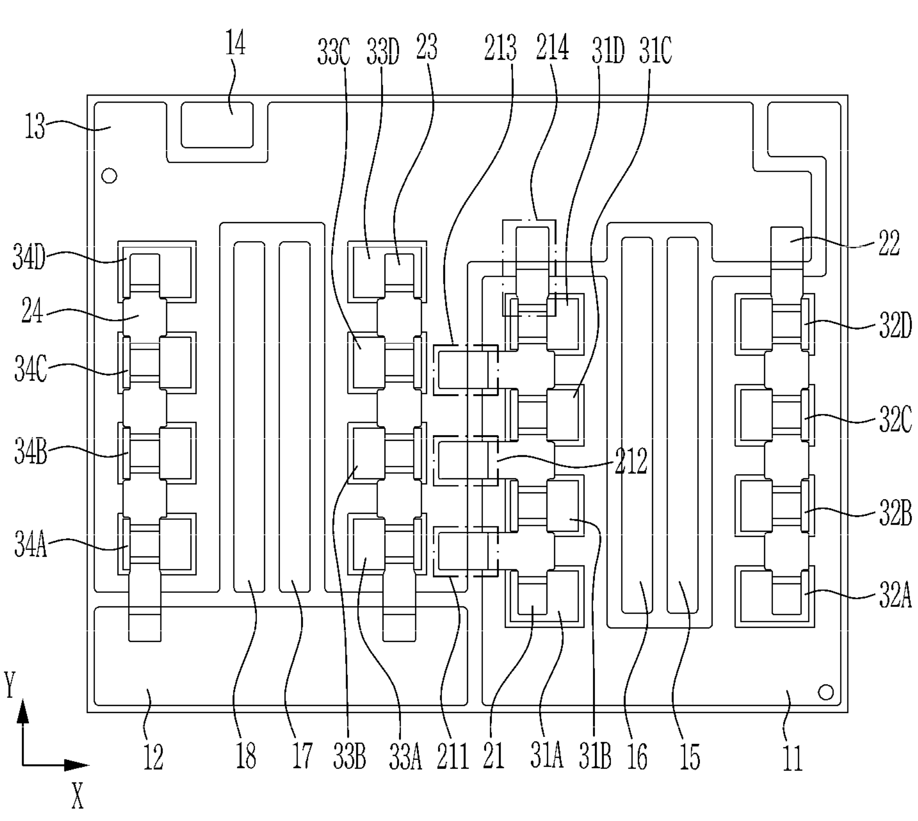

FIG. 1 to FIG. 2 are drawings for explaining a semiconductor device according to an embodiment.

Referring to FIG. 1 and FIG. 2 together, a semiconductor device 1 according to an embodiment may include a direct bonding copper (DBC) substrate 10. The DBC substrate 10 may include upper metal layers 11, 12, 13, 14, 15, 16, 17, and 18, a ceramic layer 51, and a lower metal layer 52. In this case, the ceramic layer 51 may be formed under the upper metal layers 11, 12, 13, 14, 15, 16, 17, and 18, and the lower metal layer 52 is formed under the ceramic layer 51. In some embodiments, the upper metal layers 11, 12, 13, 14, 15, 16, 17, and 18, and the lower metal layer 52 may be made of Cu, and the ceramic layer 51 may be made of Aluminum Oxide ($Al_2O_3$), Aluminum Nitride (AlN), Beryllium Oxide (BeO), Silicon Carbide (SIC), or Silicon Nitride ($Si_3N_4$).

The semiconductor device 1 may be implemented as a semiconductor module package for driving an inverter. For this purpose, the semiconductor device 1 may include semiconductor chips on the upper metal layers 11 and 13.

Semiconductor chips implementing a right phase switching pattern may be disposed on the upper metal layer 11. Here, the right phase may represent a switching state in which a relatively higher voltage is applied to a specific phase of the inverter, for example, it may indicate that the upper switch is in the ON state at a specific point in time for one phase. Specifically, in the upper metal layer 11, a plurality of semiconductor chips 31A, 31B, 31C, and 31D may be disposed along the first direction Y to form a first row, and a plurality of semiconductor chips 32A, 32B, 32C, and 32D may be disposed along the first direction Y to form a second row parallel to the first row. In this specification, a semiconductor chip may include various types of power devices, including insulated gate bipolar transistors (IGBT) and silicon carbide (SiC) devices.

Upper metal layers 15 and 16 may be formed between the first row and the second row. The upper metal layer 15 may apply a gate voltage to a plurality of semiconductor chips 31A, 31B, 31C, 31D, 32A, 32B, 32C, and 32D disposed on the upper metal layer 11. Meanwhile, the upper metal layer 16 may apply a source voltage to a plurality of semiconductor chips 31A, 31B, 31C, 31D, 32A, 32B, 32C, and 32D disposed on the upper metal layer 11. The upper metal layers 15 and 16, and the plurality of semiconductor chips 31A, 31B, 31C, 31D, 32A, 32B, 32C, and 32D may be electrically connected to each other using various electrically conductive materials including wires.

Meanwhile, semiconductor chips implementing a left phase switching pattern may be disposed on the upper metal layer 13. Here, the left phase may represent a switching state in which a relatively lower voltage is applied to a specific phase of the inverter, for example, it may indicate that the lower switch is in the ON state at a specific point in time for one phase. Specifically, in the upper metal layer 13, a plurality of semiconductor chips 33A, 33B, 33C, and 33D may be disposed along the first direction Y to form a third row, and a plurality of semiconductor chips 34A, 34B, 34C, and 34D may be disposed along the first direction Y to form a fourth row parallel to the third row.

Upper metal layers 17 and 18 may be formed between the third and fourth rows. The upper metal layer 17 may apply a gate voltage to a plurality of semiconductor chips 33A, 33B, 33C, 33D, 34A, 34B, 34C, and 34D disposed on the upper metal layer 13. Meanwhile, the upper metal layer 18 may apply a source voltage to a plurality of semiconductor chips 33A, 33B, 33C, 33D, 34A, 34B, 34C, and 34D disposed on the upper metal layer 13. The upper metal layers 17 and 18, and the plurality of semiconductor chips 33A, 33B, 33C, 33D, 34A, 34B, 34C, and 34D may be electrically connected to each other using various electrically conductive materials including wires.

In this specification, "connection" refers to an element that electrically connects one element to another element and may refer to any type of component made using an electrically conductive material, for example, a clip or a wire. Therefore, it is clear that the scope of the present invention is not limited to the case where the connection is a clip, but for clarity and convenience of explanation, the case where the connection is a clip will be mainly used as an example.

In the upper metal layer 11, a plurality of semiconductor chips 31A, 31B, 31C, and 31D disposed along the first row may be connected to each other by a connection 21, and a plurality of semiconductor chips 32A, 32B, 32C, and 32D disposed along the second row may be connected to each other by a connection 22. Specifically, the connection 21 may connect a plurality of semiconductor chips 31A, 31B, 31C, and 31D disposed along the first row in the upper metal layer 11 in series, and simultaneously connect the plurality of semiconductor chips 31A, 31B, 31C, and 31D to the upper metal layer 13 in parallel. For this purpose, the connection 21 may include parallel connection extension leg portions 211, 212, and 213 formed to extend along the second direction X, and a serial connection extension leg portion 214 formed to extend along the first direction Y. Details about the parallel connection extension leg portions 211, 212, and 213 and the serial connection extension leg portion 214 will be described later with reference to FIG. 4 and FIG. 5. The connection 22 may connect a plurality of semiconductor chips 32A, 32B, 32C, and 32D disposed along the second row in the upper metal layer 11 to each other in series.

Meanwhile, in the upper metal layer 13, a plurality of semiconductor chips 33A, 33B, 33C, and 33D disposed along the third row may be connected to each other by a connection 23, and a plurality of semiconductor chips 34A, 34B, 34C, and 34D disposed along the fourth row may be connected to each other by a connection 24. Specifically, the connection 23 may connect a plurality of semiconductor chips 33A, 33B, 33C, and 33D disposed along the third row in the upper metal layer 13 in series, and the connection 24 may connect a plurality of semiconductor chips 34A, 34B, 34C, and 34D disposed along the fourth row in the upper metal layer 11 in series.

According to the present embodiment, the connection 21 connects a plurality of semiconductor chips 31A, 31B, 31C, and 31D disposed along the first row in the upper metal layer 11 in series, and simultaneously connects the plurality of semiconductor chips 31A, 31B, 31C, and 31D to the upper metal layer 13 in parallel, so that circuit paths can be shortened and more direct, resulting in lower inductance.

Figure 3:
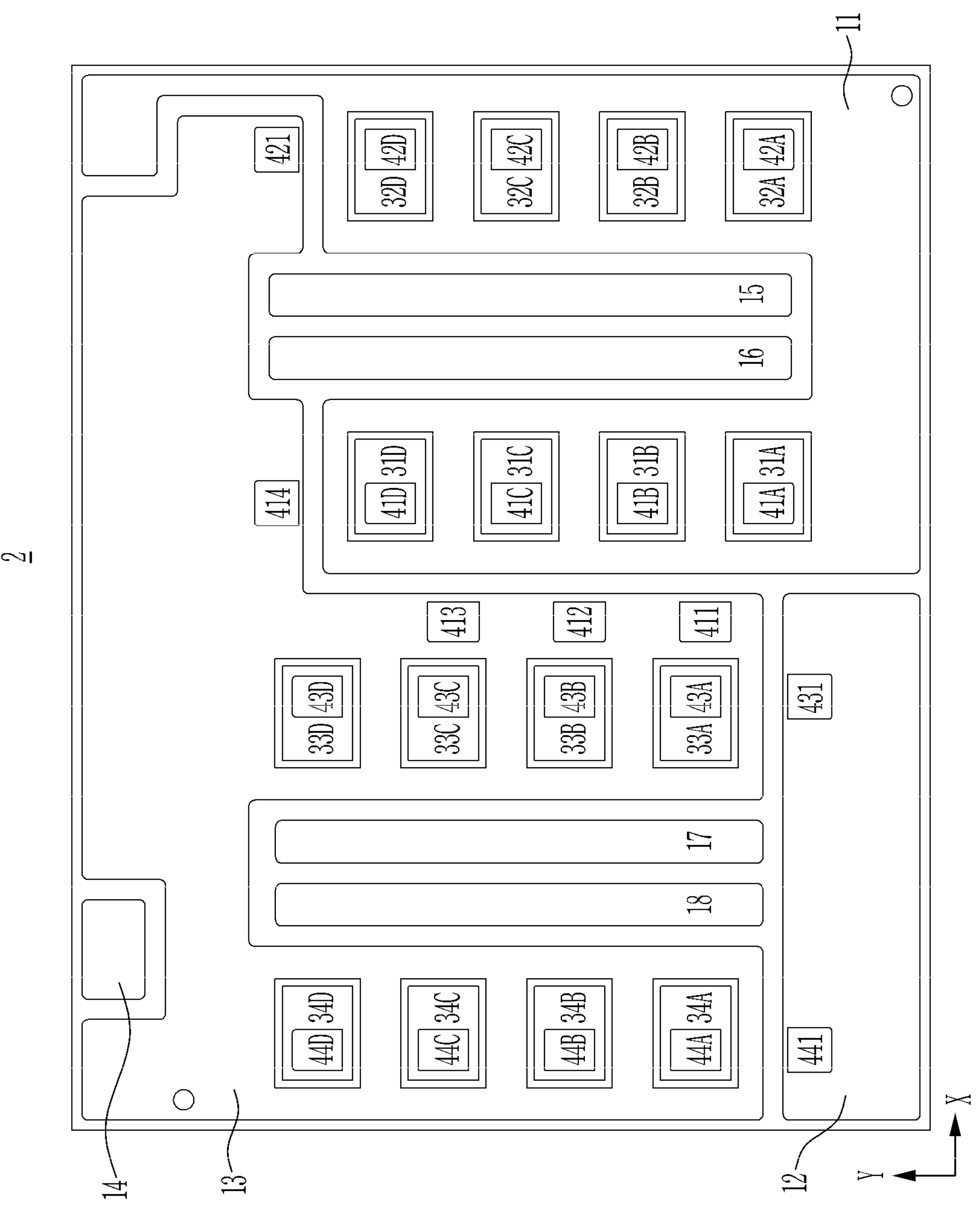
FIG. 3 is a drawing for explaining a semiconductor device according to an embodiment.

FIG. 3 is a drawing for explaining a semiconductor device according to an embodiment.

Referring to FIG. 3, the semiconductor device 2 according to one embodiment may include a DBC substrate 10 including upper metal layers 11, 12, 13, 14, 15, 16, 17, and 18, a ceramic layer 51 and a lower metal layer 52, as described above with respect to FIG. 1 and FIG. 2. And the semiconductor device 2 may be implemented as a semiconductor module package for driving an inverter. For this purpose, the semiconductor device 2 may include semiconductor chips on the upper metal layers 11 and 13.

In the upper metal layer 11, a plurality of semiconductor chips 31A, 31B, 31C, and 31D may be disposed along the first direction Y to form a first row, and a plurality of semiconductor chips 32A, 32B, 32C, and 32D may be disposed along the first direction Y to form a second row parallel to the first row. Here, the plurality of semiconductor chips 31A, 31B, 31C, 31D, 32A, 32B, 32C, and 32D may operate to implement a right phase switching pattern. Connection bonding part on semiconductor chips 41A, 41B, 41C, and 41D may be formed on the plurality of semiconductor chips 31A, 31B, 31C, and 31D, and connection bonding part on semiconductor chips 42A, 42B, 42C, and 42D may be formed on the plurality of semiconductor chips 32A, 32B, 32C, and 32D.

In the upper metal layer 13, a plurality of semiconductor chips 33A, 33B, 33C, and 33D may be disposed along the first direction Y to form a third row, and a plurality of semiconductor chips 34A, 34B, 34C, and 34D may be disposed along the first direction Y to form a fourth row parallel to the third row. Here, the plurality of semiconductor chips 33A, 33B, 33C, 33D, 34A, 34B, 34C, and 34D may operate to implement a left phase switching pattern. Connection bonding part on semiconductor chips 43A, 43B, 43C, and 43D may be formed on the plurality of semiconductor chips 33A, 33B, 33C, and 33D, and connection bonding part on semiconductor chips 44A, 44B, 44C, and 44D may be formed on the plurality of semiconductor chips 34A, 34B, 34C, and 34D.

On the upper metal layer 13, connection bonding part on substrates 411, 412, and 413 may be disposed along the first direction Y between the first row and the third row to form a fifth row. Additionally, on the upper metal layer 13, a connection bonding part on substrate 411 may be disposed on the first row, and a connection bonding part on substrate 421 may be disposed on the second row. Meanwhile, on the upper metal layer 12, a connection bonding part on substrate 431 may be disposed on the third row, and a connection bonding part on substrate 441 may be disposed on the fourth row.

The connection bonding part on substrates 411, 412, 413, and 414 of the upper metal layer 13 and the connection bonding part on semiconductor chips 41A, 41B, 41C, and 41D of the upper metal layer 11 are all connected by one connection, and the connection bonding part on substrate 421 of the upper metal layer 13 and the connection bonding part on semiconductor chips 42A, 42B, 42C, and 42D of the upper metal layer 11 are all connected by one connection. Meanwhile, the connection bonding part on substrate 431 of the upper metal layer 12 and the connection bonding part on semiconductor chips 43A, 43B, 43C, and 43D of the upper metal layer 13 are all connected by one connection, and the connection bonding part on substrate 441 of the upper metal layer 12 and the connection bonding part on semiconductor chips 44A, 44B, 44C, and 44D of the upper metal layer 13 are all connected by one connection.

According to the present embodiment, the connection bonding part on substrates 411, 412, 413, and 414 of the upper metal layer 13 and the connection bonding part on semiconductor chips 41A, 41B, 41C, and 41D of the upper metal layer 11 are all connected by one connection, so that circuit paths can be shortened and more direct, resulting in lower inductance.

Figure 4:
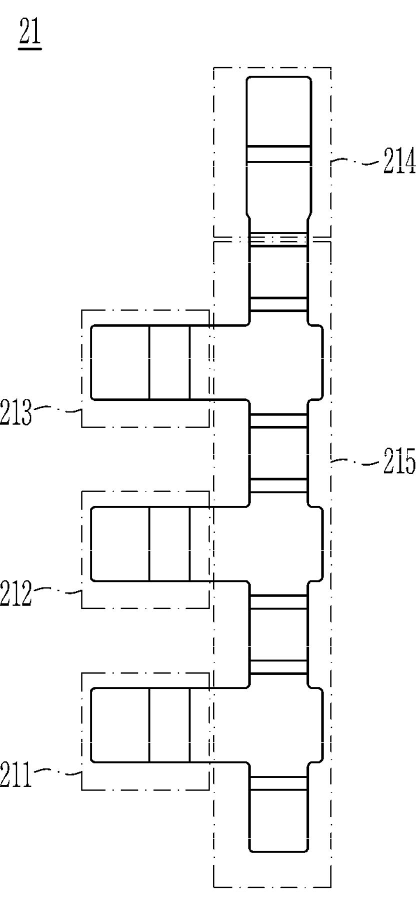
FIG. 4 to FIG. 5 are drawings for explaining a clip according to an embodiment.
Figure 5:
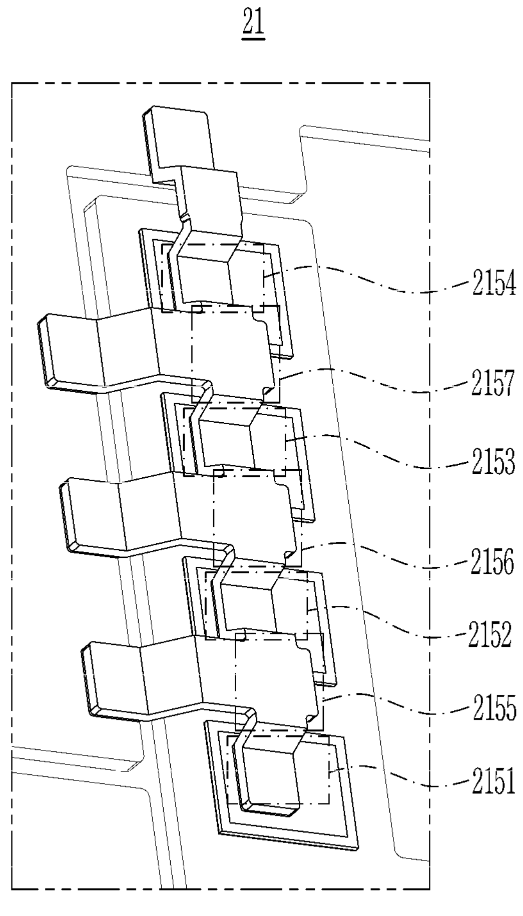

FIG. 4 to FIG. 5 are drawings for explaining a clip according to an embodiment.

Referring to FIG. 4 and FIG. 5 together, a connection 21 implemented as a clip is shown. When the connection 21 is implemented as a clip, the connection 21 may include parallel connection extension leg portions 211, 212, 213, a serial connection extension leg portion 214, and a body portion 215, and the connection 21 may be implemented with electrically conductive materials such as metal.

The body portion 215 may be formed to extend along the first direction Y. The body portion 215 may include semiconductor chip bonding regions 2151, 2152, 2153, and 2154. The semiconductor chip bonding regions 2151, 2152, 2153, and 2154 may be formed in a recessed shape so that the body portion 215 is bonded to a plurality of semiconductor chips 31A, 31B, 31C, and 31D disposed along the first row in the upper metal layer 11. The semiconductor chip bonding regions 2151, 2152, 2153, and 2154 may be bonded to the connection bonding part on semiconductor chips 41A, 41B, 41C, and 41D. Meanwhile, the body portion 215 may include extension leg portion connection regions 2155, 2156, and 2157. The extension leg portion connection regions 2155, 2156, and 2157 may be alternately disposed between the semiconductor chip bonding regions 2151, 2152, 2153, and 2154, and each formed in a protruding shape so that the body portion 215 may be connected with the parallel connection extension leg portions 211, 212, and 213.

The parallel connection extension leg portions 211, 212, and 213 may be formed to extend from the body portion 215 along the second direction X perpendicular to the first direction Y. The parallel connection extension leg portions 211, 212, and 213 may be bonded to the connection bonding part on substrates 411, 412, and 413 formed on the upper metal layer 13.

The serial connection extension leg portion 214 may be formed to extend from the body portion 215 along the first direction Y. The serial connection extension leg portion 214 may be bonded to the connection bonding part on substrate 414 formed on the upper metal layer 13.

That is, the connection 21 may form a connection to all of the connection bonding part on substrates 411, 412, and 413 formed on the upper metal layer 13, the connection bonding part on substrate 414 formed on the upper metal layer 13, and the connection bonding part on semiconductor chips 41A, 41B, 41C, and 41D.

Meanwhile, the connection 22 may include a body portion formed to extend along the first direction Y and a serial connection extension leg portion formed to extend from the body portion along the first direction Y, and may form a connection to all of the connection bonding part on substrate 421 formed on the upper metal layer 13, and the connection bonding part on semiconductor chips 42A, 42B, 42C, and 42D.

The connection 23 may include a body portion formed to extend along the first direction Y and a serial connection extension leg portion formed to extend from the body portion along the first direction Y, and may form a connection to all of the connection bonding part on substrate 431 formed on the upper metal layer 12, and the connection bonding part on semiconductor chips 43A, 43B, 43C, and 43D.

The connection 24 may include a body portion formed to extend along the first direction Y and a serial connection extension leg portion formed to extend from the body portion along the first direction Y, and may form a connection to all of the connection bonding part on substrate 441 formed on the upper metal layer 12, and the connection bonding part on semiconductor chips 44A, 44B, 44C, and 44D.

Figure 6:
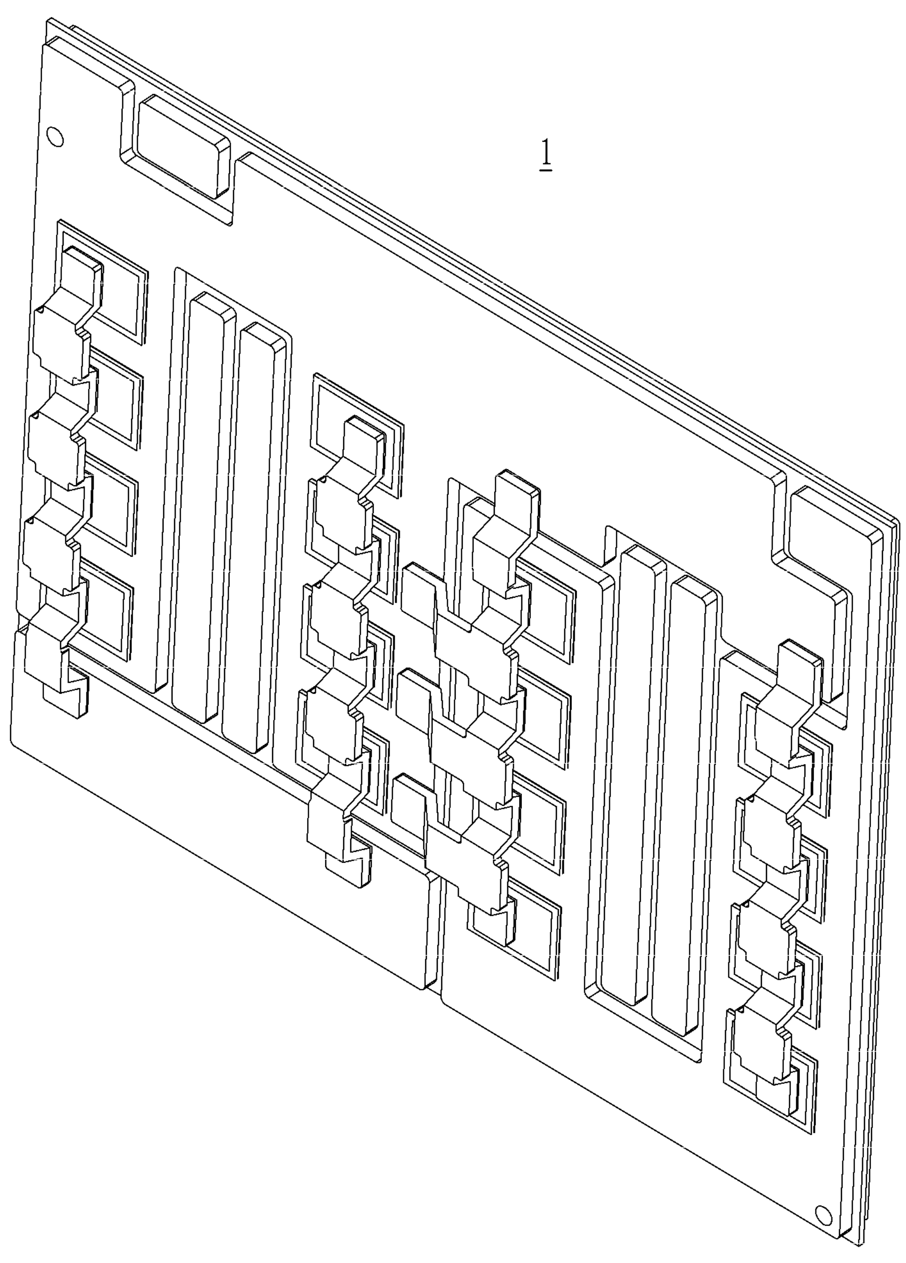
FIG. 6 is a drawing for explaining a semiconductor device according to an embodiment.

FIG. 6 is a drawing for explaining a semiconductor device according to an embodiment.

Referring to FIG. 6, the semiconductor device 1 according to an embodiment may be implemented using clips corresponding to the connections 21, 22, 23, and 24 as described in FIG. 4 and FIG. 5.

Figure 7:
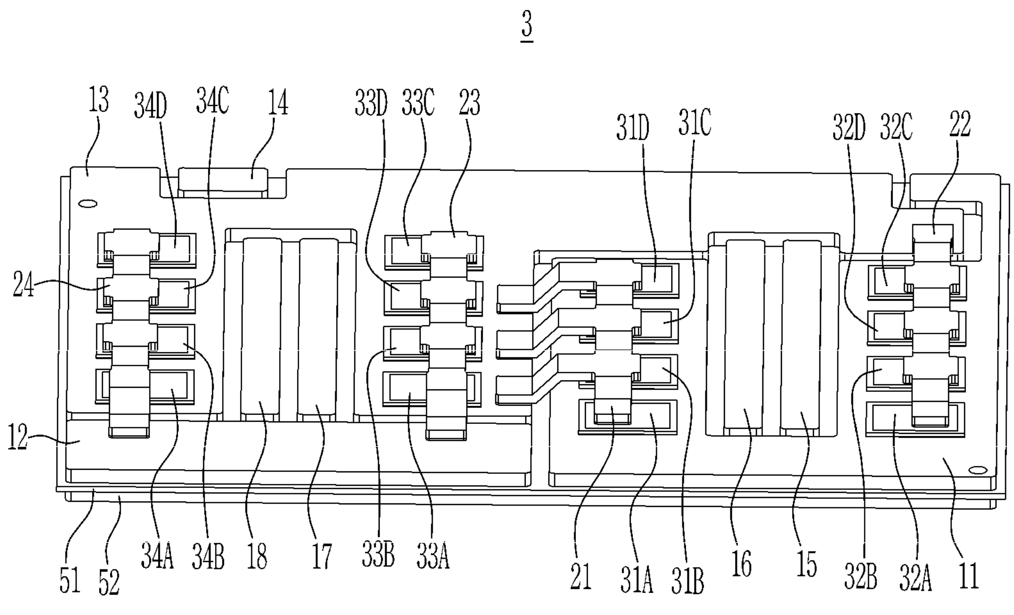
FIG. 7 to FIG. 8 are drawings for explaining a semiconductor device according to an embodiment.
Figure 8:
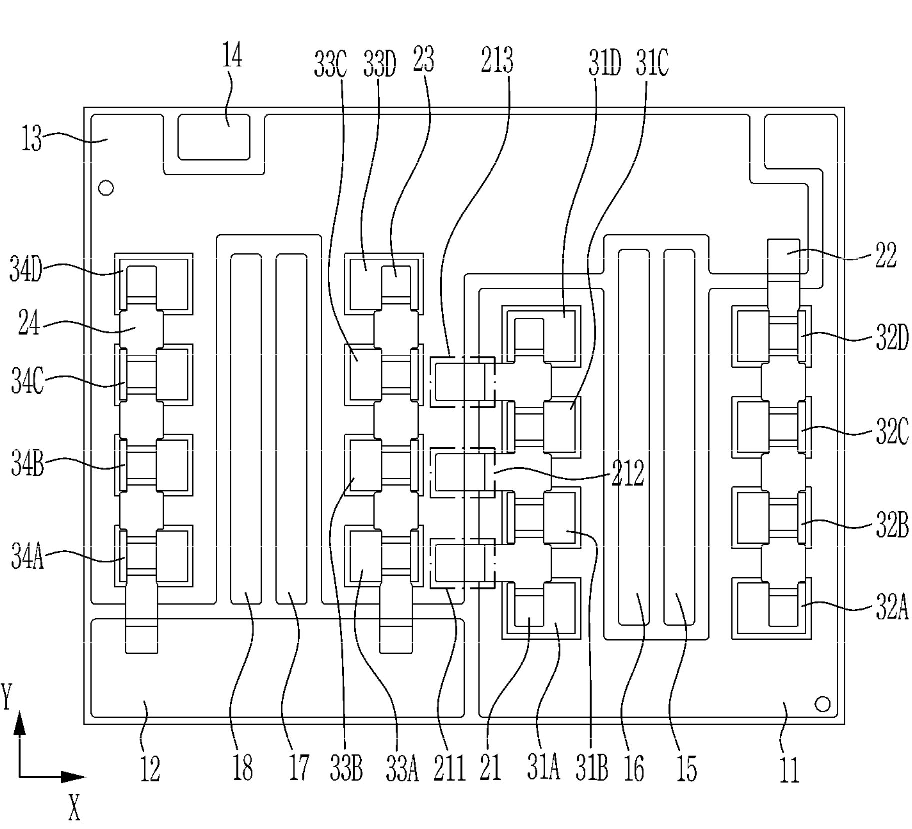

FIG. 7 to FIG. 8 are drawings for explaining a semiconductor device according to an embodiment.

Referring to FIG. 7 and FIG. 8 together, the semiconductor device 3 according to one embodiment includes a DBC substrate 10 including upper metal layers 11, 12, 13, 14, 15, 16, 17, and 18, a ceramic layer 51 and a lower metal layer 52, as described above with respect to FIG. 1 and FIG. 2. And the semiconductor device 3 may be implemented as a semiconductor module package for driving an inverter. For this purpose, the semiconductor device 3 may include semiconductor chips on the upper metal layers 11 and 13.

Semiconductor chips implementing a right phase switching pattern may be disposed on the upper metal layer 11. Specifically, in the upper metal layer 11, a plurality of semiconductor chips 31A, 31B, 31C, and 31D may be disposed along the first direction Y to form a first row, and a plurality of semiconductor chips 32A, 32B, 32C, and 32D may be disposed along the first direction Y to form a second row parallel to the first row. Upper metal layers 15 and 16 may be formed between the first row and the second row. The upper metal layer 15 may apply a gate voltage to a plurality of semiconductor chips 31A, 31B, 31C, 31D, 32A, 32B, 32C, and 32D disposed on the upper metal layer 11. Meanwhile, the upper metal layer 16 may apply a source voltage to a plurality of semiconductor chips 31A, 31B, 31C, 31D, 32A, 32B, 32C, and 32D disposed on the upper metal layer 11. The upper metal layers 15 and 16, and the plurality of semiconductor chips 31A, 31B, 31C, 31D, 32A, 32B, 32C, and 32D may be electrically connected to each other using various electrically conductive materials including wires.

Meanwhile, semiconductor chips implementing a left phase switching pattern may be disposed on the upper metal layer 13. Specifically, in the upper metal layer 13, a plurality of semiconductor chips 33A, 33B, 33C, and 33D may be disposed along the first direction Y to form a third row, and a plurality of semiconductor chips 34A, 34B, 34C, and 34D may be disposed along the first direction Y to form a fourth row parallel to the third row. Upper metal layers 17 and 18 may be formed between the third and fourth rows. The upper metal layer 17 may apply a gate voltage to a plurality of semiconductor chips 33A, 33B, 33C, 33D, 34A, 34B, 34C, and 34D disposed on the upper metal layer 13. Meanwhile, the upper metal layer 18 may apply a source voltage to a plurality of semiconductor chips 33A, 33B, 33C, 33D, 34A, 34B, 34C, and 34D disposed on the upper metal layer 13. The upper metal layers 17 and 18, and the plurality of semiconductor chips 33A, 33B, 33C, 33D, 34A, 34B, 34C, and 34D may be electrically connected to each other using various electrically conductive materials including wires.

In the upper metal layer 11, a plurality of semiconductor chips 31A, 31B, 31C, and 31D disposed along the first row may be connected to each other by a connection 21, and a plurality of semiconductor chips 32A, 32B, 32C, and 32D disposed along the second row may be connected to each other by a connection 22. Specifically, the connection 21 may connect a plurality of semiconductor chips 31A, 31B, 31C, and 31D disposed along the first row in the upper metal layer 11 in series, and simultaneously connect the plurality of semiconductor chips 31A, 31B, 31C, and 31D to the upper metal layer 13 in parallel. For this purpose, the connection 21 may include parallel connection extension leg portions 211, 212, and 213 formed to extend along the second direction X. Details about the parallel connection extension leg portions 211, 212, and 213 will be described later with reference to FIG. 10 and FIG. 11. The connection 22 may connect a plurality of semiconductor chips 32A, 32B, 32C, and 32D disposed along the second row in the upper metal layer 11 to each other in series.

Meanwhile, in the upper metal layer 13, a plurality of semiconductor chips 33A, 33B, 33C, and 33D disposed along the third row may be connected to each other by a connection 23, and a plurality of semiconductor chips 34A, 34B, 34C, and 34D disposed along the fourth row may be connected to each other by a connection 24. Specifically, the connection 23 may connect a plurality of semiconductor chips 33A, 33B, 33C, and 33D disposed along the third row in the upper metal layer 13 in series, and the connection 24 may connect a plurality of semiconductor chips 34A, 34B, 34C, and 34D disposed along the fourth row in the upper metal layer 11 in series.

According to the present embodiment, the connection 21 connects a plurality of semiconductor chips 31A, 31B, 31C, and 31D disposed along the first row in the upper metal layer 11 in series, and simultaneously connects the plurality of semiconductor chips 31A, 31B, 31C, and 31D to the upper metal layer 13 in parallel, so that circuit paths can be shortened and more direct, resulting in lower inductance.

Figure 9:
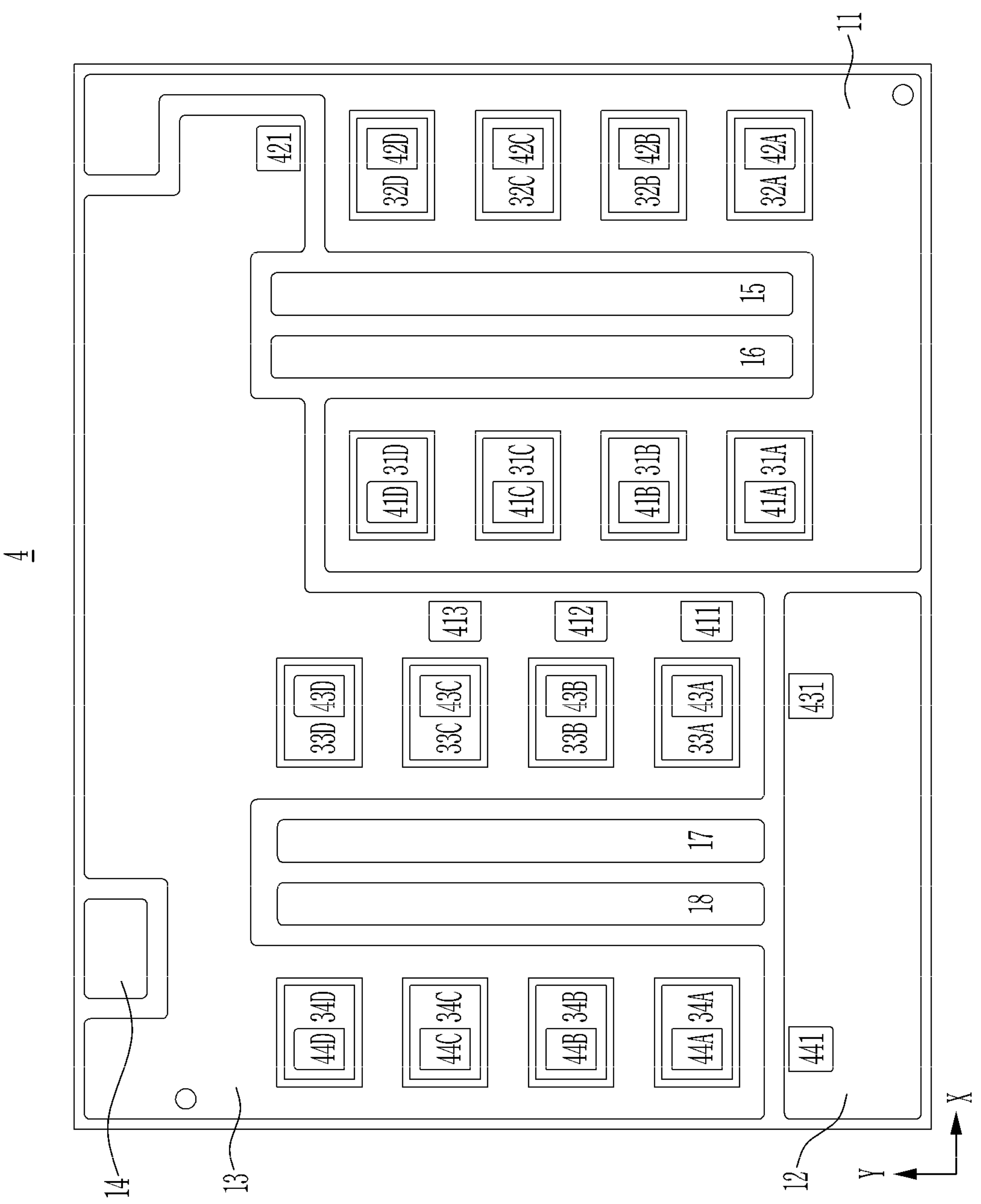
FIG. 9 is a drawing for explaining a semiconductor device according to an embodiment.

FIG. 9 is a drawing for explaining a semiconductor device according to an embodiment.

Referring to FIG. 9, the semiconductor device 4 according to one embodiment may include a DBC substrate 10 including upper metal layers 11, 12, 13, 14, 15, 16, 17, and 18, a ceramic layer 51 and a lower metal layer 52, as described above with respect to FIG. 7 and FIG. 8. And the semiconductor device 4 may be implemented as a semiconductor module package for driving an inverter. For this purpose, the semiconductor device 4 may include semiconductor chips on the upper metal layers 11 and 13.

In the upper metal layer 11, a plurality of semiconductor chips 31A, 31B, 31C, and 31D may be disposed along the first direction Y to form a first row, and a plurality of semiconductor chips 32A, 32B, 32C, and 32D may be disposed along the first direction Y to form a second row parallel to the first row. Here, the plurality of semiconductor chips 31A, 31B, 31C, 31D, 32A, 32B, 32C, and 32D may operate to implement a right phase switching pattern. Connection bonding part on semiconductor chips 41A, 41B, 41C, and 41D may be formed on the plurality of semiconductor chips 31A, 31B, 31C, and 31D, and connection bonding part on semiconductor chips 42A, 42B, 42C, and 42D may be formed on the plurality of semiconductor chips 32A, 32B, 32C, and 32D.

In the upper metal layer 13, a plurality of semiconductor chips 33A, 33B, 33C, and 33D may be disposed along the first direction Y to form a third row, and a plurality of semiconductor chips 34A, 34B, 34C, and 34D may be disposed along the first direction Y to form a fourth row parallel to the third row. Here, the plurality of semiconductor chips 33A, 33B, 33C, 33D, 34A, 34B, 34C, and 34D may operate to implement a left phase switching pattern. Connection bonding part on semiconductor chips 43A, 43B, 43C, and 43D may be formed on the plurality of semiconductor chips 33A, 33B, 33C, and 33D, and connection bonding part on semiconductor chips 44A, 44B, 44C, and 44D may be formed on the plurality of semiconductor chips 34A, 34B, 34C, and 34D.

On the upper metal layer 13, connection bonding part on substrates 411, 412, and 413 may be disposed along the first direction Y between the first row and the third row to form a fifth row. Additionally, on the upper metal layer 13, a connection bonding part on substrate 421 may be disposed on the second row. Meanwhile, on the upper metal layer 12, a connection bonding part on substrate 431 may be disposed on the third row, and a connection bonding part on substrate 441 may be disposed on the fourth row.

The connection bonding part on substrates 411, 412, and 413 of the upper metal layer 13 and the connection bonding part on semiconductor chips 41A, 41B, 41C, and 41D of the upper metal layer 11 are all connected by one connection, and the connection bonding part on substrate 421 of the upper metal layer 13 and the connection bonding part on semiconductor chips 42A, 42B, 42C, and 42D of the upper metal layer 11 are all connected by one connection. Meanwhile, the connection bonding part on substrate 431 of the upper metal layer 12 and the connection bonding part on semiconductor chips 43A, 43B, 43C, and 43D of the upper metal layer 13 are all connected by one connection, and the connection bonding part on substrate 441 of the upper metal layer 12 and the connection bonding part on semiconductor chips 44A, 44B, 44C, and 44D of the upper metal layer 13 are all connected by one connection.

According to the present embodiment, the connection bonding part on substrates 411, 412, and 413 of the upper metal layer 13 and the connection bonding part on semiconductor chips 41A, 41B, 41C, and 41D of the upper metal layer 11 are all connected by one connection, so that circuit paths can be shortened and more direct, resulting in lower inductance.

Figure 10:
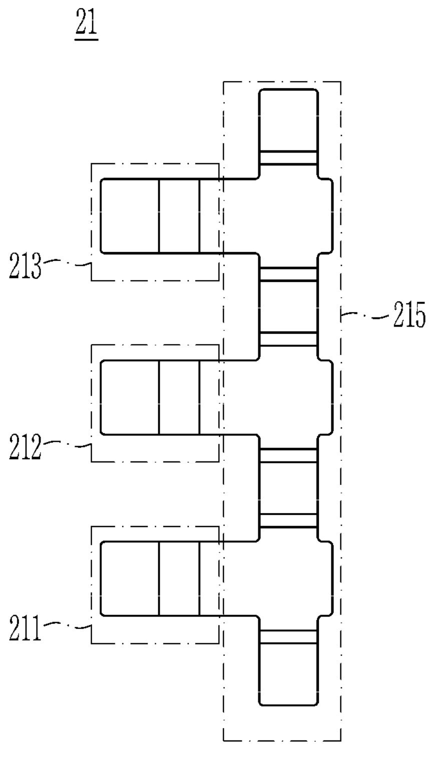
FIG. 10 to FIG. 11 are drawings for explaining a clip according to an embodiment.
Figure 11:
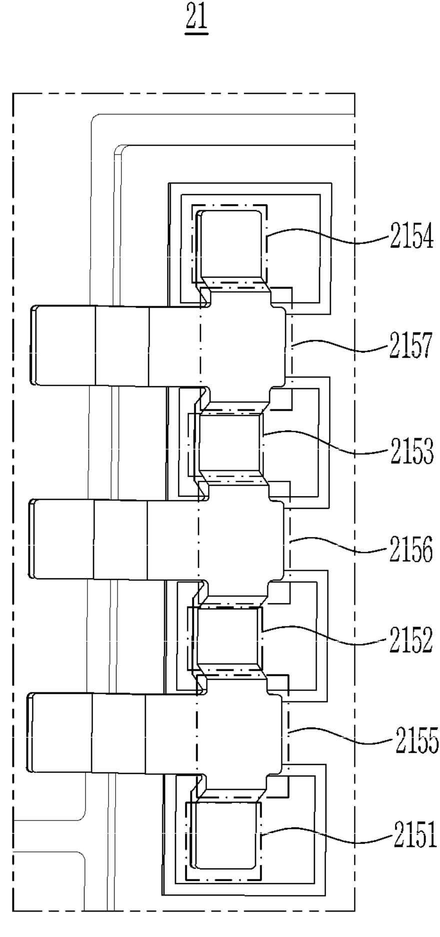

FIG. 10 to FIG. 11 are drawings for explaining a clip according to an embodiment.

Referring to FIG. 10 and FIG. 11 together, a connection 21 implemented as a clip is shown. When the connection 21 is implemented as a clip, the connection 21 may include parallel connection extension leg portions 211, 212, 213, and a body portion 215, and the connection 21 may be implemented with electrically conductive materials such as metal.

The body portion 215 may be formed to extend along the first direction Y. The body portion 215 may include semiconductor chip bonding regions 2151, 2152, 2153, and 2154. The semiconductor chip bonding regions 2151, 2152, 2153, and 2154 may be formed in a recessed shape so that the body portion 215 is bonded to a plurality of semiconductor chips 31A, 31B, 31C, and 31D disposed along the first row in the upper metal layer 11. The semiconductor chip bonding regions 2151, 2152, 2153, and 2154 may be bonded to the connection bonding part on semiconductor chips 41A, 41B, 41C, and 41D. Meanwhile, the body portion 215 may include extension leg portion connection regions 2155, 2156, and 2157. The extension leg portion connection regions 2155, 2156, and 2157 may be alternately disposed between the semiconductor chip bonding regions 2151, 2152, 2153, and 2154, and each formed in a protruding shape so that the body portion 215 may be connected with the parallel connection extension leg portions 211, 212, and 213.

The parallel connection extension leg portions 211, 212, and 213 may be formed to extend from the body portion 215 along the second direction X perpendicular to the first direction Y. The parallel connection extension leg portions 211, 212, and 213 may be bonded to the connection bonding part on substrates 411, 412, and 413 formed on the upper metal layer 13.

That is, the connection 21 may form a connection to all of the connection bonding part on substrates 411, 412, and 413 formed on the upper metal layer 13, and the connection bonding part on semiconductor chips 41A, 41B, 41C, and 41D.

Meanwhile, the connection 22 may include a body portion formed to extend along the first direction Y and a serial connection extension leg portion formed to extend from the body portion along the first direction Y, and may form a connection to all of the connection bonding part on substrate 421 formed on the upper metal layer 13, and the connection bonding part on semiconductor chips 42A, 42B, 42C, and 42D.

The connection 23 may include a body portion formed to extend along the first direction Y and a serial connection extension leg portion formed to extend from the body portion along the first direction Y, and may form a connection to all of the connection bonding part on substrate 431 formed on the upper metal layer 12, and the connection bonding part on semiconductor chips 43A, 43B, 43C, and 43D.

The connection 24 may include a body portion formed to extend along the first direction Y and a serial connection extension leg portion formed to extend from the body portion along the first direction Y, and may form a connection to all of the connection bonding part on substrate 441 formed on the upper metal layer 12, and the connection bonding part on semiconductor chips 44A, 44B, 44C, and 44D.

Figure 12:
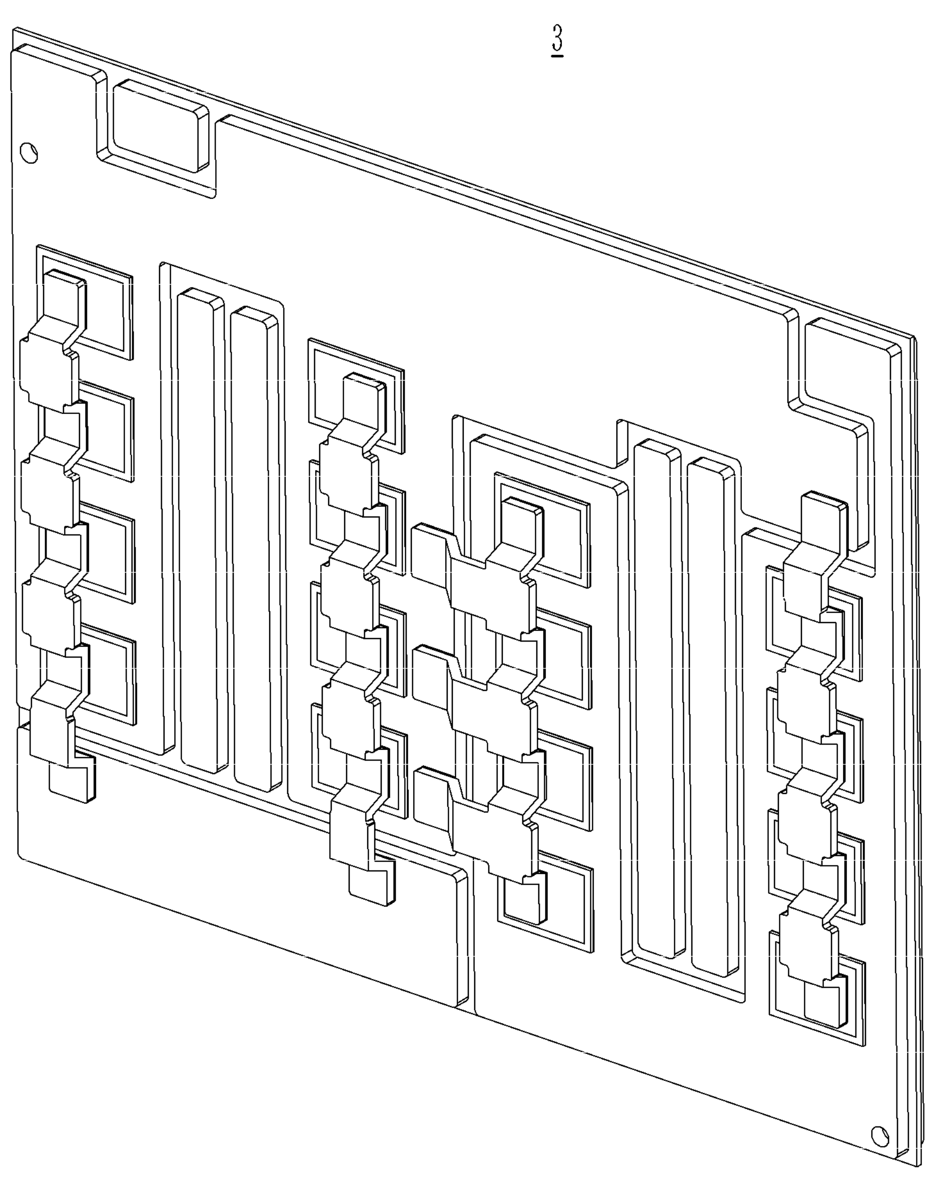
FIG. 12 is a drawing for explaining a semiconductor device according to an embodiment.

FIG. 12 is a drawing for explaining a semiconductor device according to an embodiment.

Referring to FIG. 12, the semiconductor device 3 according to an embodiment may be implemented using clips corresponding to the connections 21, 22, 23, and 24 as described in FIG. 10 and FIG. 11.

According to the embodiments described so far, clips designed to support both serial and parallel connection of semiconductor chips are used, the inductance can be lowered without increasing the size of the package by changing the arrangement of the semiconductor chip or increasing the number of connection terminals.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A semiconductor device implemented as a semiconductor module package for driving an inverter, the semiconductor device comprising:

a first upper metal layer in which a first plurality of semiconductor chips implementing a right phase switching pattern are disposed along a first direction to form a first row;

a second upper metal layer in which a second plurality of semiconductor chips implementing a left phase switching pattern are disposed along the first direction to form a second row;

a first connection, in the first upper metal layer, connecting the first plurality of semiconductor chips disposed along the first row to each other in series and to the second upper metal layer in parallel; and a second connection, in the second upper metal layer, connecting the second plurality of semiconductor chips disposed along the second row to each other in series.

2. The semiconductor device of claim 1, wherein:

the first connection includes:

a body portion formed to extend along the first direction; and a parallel connection extension leg portion formed to extend from the body portion along a second direction perpendicular to the first direction.

3. The semiconductor device of claim 2, wherein:

the body part includes:

semiconductor chip bonding regions each formed in a recessed shape to be bonded the first plurality of semiconductor chips; and extension leg portion connection regions alternately disposed between the semiconductor chip bonding regions, and each formed in a protruding shape to be connected with the parallel connection extension leg portion.

4. The semiconductor device of claim 3, wherein:

a connection bonding part on semiconductor chip to which the semiconductor chip bonding region is bonded is formed on the first plurality of semiconductor chips of the first upper metal layer.

5. The semiconductor device of claim 4, wherein:

the first upper metal layer includes:

a connection bonding part on substrate where the parallel connection extension leg portion is bonded to the first upper metal layer, and the first connection forms a connection to both the connection bonding part on substrate to which the parallel connection extension leg portion is bonded, and the connection bonding part on semiconductor chip.

6. The semiconductor device of claim 5, wherein:

the first connection further includes:

a serial connection extension leg portion formed to extend from the body portion along the first direction.

7. The semiconductor device of claim 6, wherein:

the first upper metal layer further includes:

a connection bonding part on substrate where the serial connection extension leg portion is bonded to the first upper metal layer, and the first connection forms a connection to all of the connection bonding part on substrate to which the parallel connection extension leg portion is bonded, the connection bonding part on substrate to which the serial connection extension leg portion is bonded, and the connection bonding part on semiconductor chip.

8. The semiconductor device of claim 1, wherein:

the second connection includes:

a body portion formed to extend along the first direction; and a serial connection extension leg portion formed to extend from the body portion along the first direction.

9. The semiconductor device of claim 8, further comprising:

a third upper metal layer including a connection bonding part on substrate to which the serial connection extension leg portion is bonded, wherein the second connection forms a connection to all of the connection bonding part on substrate to which the serial connection extension leg portion is bonded, and bonding parts formed on the second plurality of semiconductor chips of the second upper metal layer.

10. The semiconductor device of claim 1, further comprising:

a fourth upper metal layer that applies a gate voltage to the first plurality of semiconductor chips disposed on the first upper metal layer;

a fifth upper metal layer that applies a source voltage to the first plurality of semiconductor chips disposed on the first upper metal layer;

a sixth upper metal layer that applies a gate voltage to the second plurality of semiconductor chips disposed on the second upper metal layer; and a seventh upper metal layer that applies a source voltage to the second plurality of semiconductor chips disposed on the second upper metal layer.

11. The semiconductor device of claim 1, wherein:

the first upper metal layer and the second upper metal layer are included in an upper substrate, a ceramic layer is formed under the upper substrate, and a lower metal layer is formed under the ceramic layer.

12. The semiconductor device of claim 1, wherein:

the connection includes a clip or a wire.

13. A semiconductor device implemented as a semiconductor module package for driving an inverter, the semiconductor device comprising:

a first upper metal layer in which a first plurality of semiconductor chips implementing a right phase switching pattern are disposed along a first direction to form a first row; and a second upper metal layer in which a second plurality of semiconductor chips implementing a left phase switching pattern are disposed along the first direction to form a second row, wherein a connection bonding part on semiconductor chip is formed on the first plurality of semiconductor chips of the first upper metal layer, and a connection bonding part on substrate is disposed along the first direction between the first row and the second row to form a third row on the second upper metal layer.

14. The semiconductor device of claim 13, wherein:

the connection bonding part on substrate and the connection bonding part on semiconductor chip on the first upper metal layer are all connected by one connection.

15. The semiconductor device of claim 13, wherein:

a connection bonding part on substrate is further disposed on the first row on the second upper metal layer.

16. The semiconductor device of claim 15, wherein:

the connection bonding part on substrate on the third row, the connection bonding part on substrate on the first row, and the connection bonding part on semiconductor chip on the first upper metal layer are all connected by one connection.

17. The semiconductor device of claim 13, wherein:

a connection bonding part on semiconductor chip is formed on the second plurality of semiconductor chips of the second upper metal layer.

18. The semiconductor device of claim 17, further comprising:

a third upper metal layer including a connection bonding part on substrate, wherein the connection bonding part on substrate and the connection bonding part on semiconductor chip on the second upper metal layer are all connected by one connection.

19. The semiconductor device of claim 13, further comprising:

a fourth upper metal layer that applies a gate voltage to the first plurality of semiconductor chips disposed on the first upper metal layer;

a fifth upper metal layer that applies a source voltage to the first plurality of semiconductor chips disposed on the first upper metal layer;

a sixth upper metal layer that applies a gate voltage to the second plurality of semiconductor chips disposed on the second upper metal layer; and a seventh upper metal layer that applies a source voltage to the second plurality of semiconductor chips disposed on the second upper metal layer.

20. The semiconductor device of claim 13, wherein:

the first upper metal layer and the second upper metal layer are included in an upper substrate, a ceramic layer is formed under the upper substrate, and a lower metal layer is formed under the ceramic layer.

* * * * *